United States Patent
Zhu et al.

(10) Patent No.: US 9,400,220 B2
(45) Date of Patent: Jul. 26, 2016

(54) METHOD FOR DETECTING FOCUS PLANE BASED ON HARTMANN WAVEFRONT DETECTION PRINCIPLE

(71) Applicant: The Institute of Optics and Electronics, The Chinese Academy of Sciences, Chengdu, Sichuan (CN)

(72) Inventors: Xianchang Zhu, Chengdu (CN); Song Hu, Chengdu (CN); Lixin Zhao, Chengdu (CN)

(73) Assignee: The Institute of Optics and Electronics, The Chinese Academy of Sciences, Chengdu, Sichuan (CN)

( * ) Notice: Subject to any disclaimer, the term of this patent is extended or adjusted under 35 U.S.C. 154(b) by 0 days.

(21) Appl. No.: 14/857,320

(22) Filed: Sep. 17, 2015

(65) Prior Publication Data
US 2016/0084714 A1 Mar. 24, 2016

(30) Foreign Application Priority Data
Sep. 19, 2014 (CN) .......................... 2014 1 0479415

(51) Int. Cl.
*G02B 21/00* (2006.01)
*G01J 9/00* (2006.01)
*G03F 1/00* (2012.01)
*G03F 7/20* (2006.01)

(52) U.S. Cl.
CPC .................. *G01J 9/00* (2013.01); *G02B 21/008* (2013.01); *G03F 7/70258* (2013.01)

(58) Field of Classification Search
USPC ............. 356/124, 124.5, 125, 126, 127, 317, 356/318; 340/5, 30; 355/53, 55, 322; 359/368, 370, 385
See application file for complete search history.

(56) References Cited

U.S. PATENT DOCUMENTS

| | | | | |
|---|---|---|---|---|
| 2006/0068301 A1* | 3/2006 | Hirukawa | ........... | G03F 7/70258 430/5 |
| 2006/0285100 A1* | 12/2006 | Hamatani | ........... | G03F 7/70258 355/55 |
| 2011/0300490 A1* | 12/2011 | Rachet | ............... | G02B 21/0032 430/322 |
| 2013/0297015 A1* | 11/2013 | Johns | ........................ | A61F 2/14 623/4.1 |
| 2014/0160267 A1* | 6/2014 | Kawakami | ........... | G02B 21/244 348/79 |
| 2015/0185454 A1* | 7/2015 | Kalkbrenner | ...... | G02B 21/0032 250/550 |

* cited by examiner

*Primary Examiner* — Sang Nguyen
(74) *Attorney, Agent, or Firm* — Merchant & Gould P.C.

(57) ABSTRACT

The present disclosure relates to a method for detecting focus plane based on Hartmann wavefront detection principle, the function of which is to detect the position of a silicon wafer in a photolithograph machine in real time so as to accomplish adjustment of the leveling and focus of the silicon wafer. By utilizing microlens array to detect the wavefront carrying information about the position of the silicon wafer based on the Hartmann wavefront detection principle, the spherical wavefront is divided by the respective subunits of the microlens array and is imaged on the respective focus planes of the subunits. If the silicon wafer is located on the focal plane, the incident wavefront for the microlens array is a planar wavefront so that the diffraction light spots are on the focus of the respective subunits of the microlens array; and if the silicon wafer is defocused, the incident wavefront for the microlens array is a spherical wavefront so that the diffraction light spots are shifted on the focus plane of the microlens array. Based on Hartmann wavefront detection principle, the detection of the spherical wavefront may be implemented by the microlens array shifting the imaged light spots for the plane wavefront and the spherical wavefront, so as to accomplish the defocusing measurement for the silicon wafer. The system for detecting focus plane has a simple configuration, a higher accuracy and efficiency, so it is applied to measurement for detecting the focus plane in various types of photolithography machines in a high accuracy and in real time.

7 Claims, 2 Drawing Sheets

METHOD FOR DETECTING FOCUS PLANE BASED ON HARTMANN WAVEFRONT DETECTION PRINCIPLE

This claims benefit of Serial No. 201410479415.1, filed 19 Sep. 2014, in China and which application is incorporated herein by reference. To the extent appropriate, a claim of priority is made to the above disclosed application.

TECHNICAL FIELD

The present disclosure relates to methods for detecting focus plane based on Hartmann wavefront detection principle, which is applied for detecting focus plane of a silicon wafer in a photolithography machine in a high accuracy and belongs to a field of microelectronic device and micro machining.

BACKGROUND

The microelectronic technique, the core of which is large scale integrated circuit, is rapidly developed and provides new demands for the micro machining and micro- and nano-detection technique. Since the first commercial projection photolithography machine is developed in American at 1978, the optical projective exposure become a micro machining technique with the widest application, rapid updates and strong vitality, and the core technique to improve the microelectronic technique. Resolution and focal depth of object lens are critical parameters which affect the exposure system. The resolution and focal depth may be calculated based on Rayleigh criterion as follows:

$k_1 \lambda / NA$, and $DOF = k_2 \lambda / NA^2$.

The resolution for the projection photolithography may be improved mainly by utilizing an exposure light source with more and more smaller wavelength and enhancing a numerical aperture (NA) of the objective lens. At present, exposure wavelength A for the projection photolithography machine is developed from ultraviolet (g-line, i-line) and deep ultraviolet (ArF) towards extreme ultraviolet (EUV), and the NA of the objective lens is developed from 0.2 and 0.8 towards above 1.35 for an immerged projection photolithography. The improvement of the resolution for photolithography is at the cost of focal depth. The focal depth of the projection lens is drastically reduced with the improvement of the resolution for photolithography. Although the resolution may be further improved by utilizing a resolution enhancement technique, it is limited for the improvement of the focal depth. Thus, there is a new demand for the accuracy for adjusting the focal plane of the system by the photolithography machine with a high accuracy.

A measuring sensor for adjusting leveling and focal plane in the photolithography machine usually utilizes an optical sensing technique which has features of speediness, non-contact and so on. Earlier photolithograph machines mostly employ a technique of detecting luminosity and detecting of CCD. By imaging with a slot, a defocusing distance of a silicon wafer may be calculated by computing change of displacement of the slot in a detector. These two detecting methods have a simple measuring system and are easy to be operated; but they have a lower accuracy of measurement and can't meet the requirements of the photolithography on the detection of the focus plane in a higher accuracy. With the enhancement of resolution of the photolithography system and the enlargement of the exposure visual field, the measuring system for adjusting leveling and the focus plane may further utilizes a multipoint measurement in which the height values at multiple points are measured to calculate amounts of inclination of the silicon, which is mainly used by a Japanese company of Nikon. An emerging light of a light source passes through an array of slots, is reflected by a surface of the silicon wafer and is imaged on the detector. When the silicon wafer is in an ideal state, the imaged light spot is located at the center of four-quadrant detector so that the light intensities in the four quadrants. The detection system utilizes the array of slots to cover the whole exposure visual filed by scanning measurements. However, it is necessary to further optimize the algorithm for detection to improve the accuracy of measurement.

With the development of grating detection in the last century, a detection technique based on moiré fringe generated by Talbot effect of a grating is applied to measurements for detecting focus plane in a projection photolithography system. When intervals between two diffraction gratings with comparative cycles satisfy a Talbot distance, a moiré fringe is generated by the two gratings. If the relative positions of the grating and the detector is constant, the signal of the moiré fringe changes due to the change of position of the silicon wafer. Thus, the measurement of defocusing distance of the silicon wafer may be accomplished by measuring information about the change of the moiré fringes. Although such a method has a higher accuracy for detection, the system has a weak anti-interference capability and has a higher requirement for the environment.

A measurement based on gaps of a chirp grating is proposed by Euclid E. Moon et.al. MIT, in 2004 to be applied to measurement for detecting focus plane in the photolithography machine, so as to obtain a detection accuracy in a scale of nanometer. However, since it is limited by graphic processing algorithm and phase analytic algorithm, the system has a poor property in real time and a lower efficiency in detection.

In 2007, researchers in US proposed a method for measuring the focus plane by utilizing aerodynamics principle. A basic idea of this aerodynamic gap measurement is to blast air to a measured surface through a spray nozzle, the change of the gap leads to changes of a return pressure of the spray nozzle and the airflow. Such changes are measured by a pressure sensor or a Flowmeter and then the amount of the gap is derived from it. Due to a higher influence of the environment, there is a report of principle experiment in laboratory, but there is not a success for an actual prototype.

Technique of detecting focus plane in a scale of nanometer based on a spatial light modulation principle is widely used to measurement for detecting the focus plane in a high accuracy for an advanced photolithography machine. The measuring system is constituted of an illuminated light source with a wideband spectrum, a telecentric imaging system and a spatial light modulation and detection system. Such a detection method has a higher accuracy of measurement and can meet the requirement of the photolithography machine in a high accuracy. However, such a system has a complex configuration and employs a detection of point by point scanning, the efficiency of which is lower.

With a development of microfabrication in China, the researchers are focused on the technique for adjusting the focus plane in the photolithography machine. At present, the community for researching the technique for adjusting the focus plane in the photolithography comprises the Institute of Optics and Electronics of the Chinese Academy of Science, Shanghai Micro Electronics Equipment Co, LTD, Huazhong University of Science and Technology, Shanghai Institute of Optics and Fine Mechanics of Chinese Academy of Science and so on.

Among others, the PSD technique is used to measuring for detecting the focus plane by Shanghai Micro Electronics Equipment Co, LTD. The laser beam is collimated, passes through the slots, and is imaged on the silicon wafer. The image is reflected by the surface of the silicon wafer and a mirror and is imaged on the PSD. The whole surface of the silicon wafer is scanned by moving the work table so as to measure the whole silicon wafer. A defocusing distance of the silicon wafer may be calculated by information about the height of the scanned silicon wafer so as to ensure the whole precision for adjusting the focus plane.

Zuohai, YING et. al. at Huazhong University of Science and Technology utilize an array CCD detector to accomplish the measurement for detecting the focus plane in the photolithography machine. Institute of Optics and Electronics of the Chinese Academy of Science is one of the communities which early develops the relevant techniques about the microelectronics equipments and utilizes a method of moiré fringe in a project of 0.8 µm-photolithography machine to obtain a precision of 80 nm for detecting the focus plane.

In general, the currently reported method for detecting the focus plane can't give attention to two or more things of simplicity of the system and the precision of the detection, and can't give attention to two or more things of the precision for detecting the focus plane and the efficiency in a large-area exposure system. For the requirements of higher resolution and higher visual field in the future projection photolithography machines, the present disclosure introduces a method for detecting the focus plane based on Hartmann wavefront detection principle so as to meet the requirements of high precision for detecting the focus plane and the efficiency in the photolithography machines.

SUMMARY

The present disclosure provides a method for detecting focus plane based on Hartmann wavefront detection principle, which is applied to the adjustment of the leveling and focus of various types of photolithography machines.

The technical solution utilized by the present disclosure is shown as follows. The method for detecting focus plane based on Hartmann wavefront detection principle is implemented by a system for detecting focus plane constituted of a light source and beam collimating and expanding unit 1, frontal set of lens 2, measured silicon wafer 3, posterior set of lens 4, microlens array 5 and CCD detector 6. The front set of lens 2 and the posterior set of lens 5 forms a 4f system, and the measured silicon wafer 3 is on a cofocal plane of the 4f system. The method for detecting focus plane is characterized by that an emerging planar wavefront of the light source and the beam collimating and expanding unit 1 passes through the frontal set of lens 2, is incident on a surface of the measured silicon wafer 3 and reflected by the measured silicon wafer 3, passes through the posterior set of lens 4 and the microlens array 5, and finally imaged in the CCD detector. If the measured silicon wafer 3 is located on the cofocal plane of the frontal set of lens 2 and the posterior set of lens 4, the microlens array 5 enables imaging of the planar wavefront; and if the measured silicon wafer 3 is defocused, the microlens array 5 enables imaging of the spherical wavefront. The measurement for detecting the focus plane of the measured silicon wafer 3 may be accomplished based on varied situations of the imaged light spot in the CCD detector 6.

The method for detecting focus plane based on Hartmann wavefront detection principle is characterized by that if the measured silicon wafer 3 is located on the cofocal plane of the frontal set of lens 2 and the posterior set of lens 4, the emerging planar wavefront of the light source and the beam collimating and expanding unit 1 after passing through the 4f system may be still a planer wavefront, the microlens array 5 enables imaging of the planar wavefront, and an intensity of diffraction light in the CCD detector 6 is shown as:

$$I = \sum I_0 \left[ \frac{2J_1(Z)}{Z} \right] = \sum_{n=-N}^{N} \sum_{m=-M}^{M} I_0 \left[ \frac{2J_1\left(\frac{kd\sqrt{(x-nd)^2+(y-md)^2}}{2f}\right)}{\frac{kd\sqrt{(x-nd)^2+(y-md)^2}}{2f}} \right],$$

in which, $J_1(Z)$ is the first order Bessel function, d is a caliber of subunits of the microlens array, f is a focal length of the microlens array, M and N are numbers of the row and columns of the microlens array, $k=2\pi/\lambda$ is a wave number corresponding the wavelength $\lambda$, and x and y are coordinates in the CCD detector. It is indicated by analysis that when the measured silicon wafer is located at the cofocal plane of the frontal set of lens 2 and the posterior set of lens 4, the diffraction light spot in the CCD detector 6 is at the focus of the respective subunits of the microlens array 5.

The method for detecting focus plane is characterized by that when the measured silicon wafer 3 is at a defocused position, the emerging planar wavefront of the light source and the beam collimating and expanding unit 1 after passing through the 4f system becomes a spherical wavefront and the microlens array 5 enables imaging of the spherical wavefront. In particular, according a triangulation theory, when the silicon wafer is defocused an amount of h in an upwards and downwards direction, it corresponds to a defocusing distance in an axial direction equal to 2h sin β, in which β is an angle between an optical axis of the system for detecting focus plane and the measured silicon wafer 3.

The method for detecting focus plane is characterized by that if the measured silicon wafer 3 is at a defocused position, the microlens array 5 enables imaging of the spherical wavefront. Based on the Hartmann wavefront detection principle, centers of the respective subunits of the microlens array 5, centers of the diffraction light spots corresponding to the subunits, and the center of the curvature of the spherical wavefront are collinear. For the imaging of the spherical wavefront, the center of its diffraction light spot satisfies the following equation:

$$\frac{\Delta p_{mn}}{f} = \frac{\sqrt{m^2+n^2}\,d}{L} = \frac{\sqrt{m^2+n^2}\,d}{\frac{f_4^2}{s}+2f+d_f},$$

in which, $\Delta p_{mn}$ is a shift of the light spot imaged on the planar and spherical wavefront by the subunit at the $m^{th}$ row and the $n^{th}$ column of the microlens array 5; L is a distance from the center of the curvature of the spherical wavefront to the focal plane of the microlens array 5 in the axial direction; $f_4$ is the focal length of the posterior set of lens 4; and $d_f$ is a distance from a image-side focal plane of the posterior set of lens 4 to a objective-side focal plane of the microlens array 5.

The method for detecting focus plane is characterized by that the measurement for detecting focus plane of the measured silicon wafer 3 is implemented by shifting the imaged light spots for the planar wavefront and the spherical wavefront through the microlens array 5. Equations are established for different subunits of the microlens array 5 as follows:

$$\begin{cases} \dfrac{\Delta p_{11}}{f} = \dfrac{\sqrt{2}\,d}{\dfrac{f_4^2}{s} + 2f + d_f} \\ \dfrac{\Delta p_{12}}{f} = \dfrac{\sqrt{5}\,d}{\dfrac{f_4^2}{s} + 2f + d_f} \\ \quad \cdots \\ \dfrac{\Delta p_{mn}}{f} = \dfrac{\sqrt{m^2 + n^2}\,d}{\dfrac{f_4^2}{s} + 2f + d_f} \end{cases}$$

Solutions for the equations (s) are solved by a least square method, so that defocus positions of the measured silicon wafer 3 which can be measured for different subunits of the microlens array 5 may be calculated as follows:

$$\bar{s} = \dfrac{1}{MN} \sum_{m=1}^{M} \sum_{n=1}^{N} s_{mn}.$$

The method for detecting focus plane is characterized by that he measurement for detecting focus plane of the measured silicon wafer 3 is implemented by averaging the defocusing distances measured for different subunits. Thus, a calculation for a plurality of measurement data can be accomplished by one measurement, and the accuracy and efficiency for detecting focus plane of the silicon wafer may be improved.

The advantageous of the present disclosure over the prior at are shown as follows:

1) Based on the Hartmann wavefront detection principle, the detection of the spherical wavefront may be implemented by the microlens array shifting the imaged light spots for the plane wavefront and the spherical wavefront, so as to accomplish the defocusing measurement for the silicon wafer. The system for detecting focus plane has a simple configuration, a higher accuracy and efficiency, so it is applied to measurement for detecting the focus plane in various types of photolithography machines in a high accuracy and in real time.

2) Since it is imaged by different subunits of the microlens array, measurements for detecting focus plane of the silicon wafer can be accomplished by the plurality of subunits in one measurement. The accuracy and efficiency for measurement may be greatly improved by calculating average values of a plurality of measured values.

3) The method according to the present invention simply processes data, and implements measurements for detecting focus plane in a high accuracy by measuring centers of the imaged light spots for the planar wavefront and the spherical wavefront.

BRIEF DESCRIPTION OF THE DRAWINGS

The method for detecting focus plane based on the Hartmann wavefront detection principle are further illustrated in the accompany figures, the particular configuration of the measurement system and the measurement principle of which would be described in detail as follows:

FIG. 2(*b*) shows an imaged light spot for the spherical wavefront; and FIG. 2(*c*) shows a comparison between the imaged light spots for the planar wavefront and the spherical wavefront.

DETAILED DESCRIPTION

Figure 1:
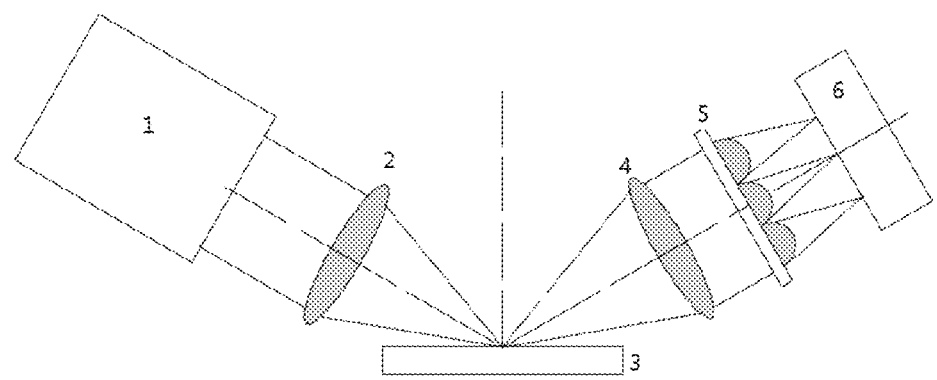
FIG. 1 is a schematic view of the system for detecting focus plane according to the present invention.

In order to implement an exact online measuring for detecting focal plane of a silicon wafer in a photolithography system, the present invention utilizes a Hartmann wavefront detection principle to accomplish such a measurement by analyzing difference between the imaged light spots for the planar wavefront and the spherical wavefront through a microlens array. The system for detecting focus plane is shows in FIG. 1.

In particular, the method for detecting focus plane based on Hartmann wavefront detection principle is implemented by a system for detecting focus plane constituted of a light source and beam collimating and expanding unit 1, frontal set of lens 2, measured silicon wafer 3, posterior set of lens 4, microlens array 5 and CCD detector 6. The front set of lens 2 and the posterior set of lens 5 forms a 4f system, and the measured silicon wafer 3 is on a cofocal plane of the 4f system. The method for detecting focus plane is characterized by that an emerging planar wavefront of the light source and the beam collimating and expanding unit 1 passes through the frontal set of lens 2, is incident on a surface of the measured silicon wafer 3 and reflected by the measured silicon wafer 3, passes through the posterior set of lens 4 and the microlens array 5, and finally imaged in the CCD detector. If the measured silicon wafer 3 is located on the cofocal plane of the frontal set of lens 2 and the posterior set of lens 4, the microlens array 5 enables imaging of the planar wavefront; and if the measured silicon wafer 3 is defocused, the microlens array 5 enables imaging of the spherical wavefront. The measurement for detecting the focus plane of the measured silicon wafer 3 may be accomplished based on varied situations of the imaged light spot in the CCD detector 6.

The method for detecting focus plane based on Hartmann wavefront detection principle is characterized by that if the measured silicon wafer 3 is located on the cofocal plane of the frontal set of lens 2 and the posterior set of lens 4, the emerging planar wavefront of the light source and the beam collimating and expanding unit 1 after passing through the 4f system may be still a planer wavefront, so the microlens array 5 enables imaging of the planar wavefront, and an intensity of diffraction light in the CCD detector 6 is shown as:

$$I = \sum I_0 \left[ \dfrac{2J_1(Z)}{Z} \right] = \sum_{n=-N}^{N} \sum_{m=-M}^{M} I_0 \left[ \dfrac{2J_1\left( \dfrac{kd\sqrt{(x-nd)^2 + (y-md)^2}}{2f} \right)}{\dfrac{kd\sqrt{(x-nd)^2 + (y-md)^2}}{2f}} \right],$$

in which, $J_1(Z)$ is the first order Bessel function, d is a caliber of subunits of the microlens array, f is a focal length of the microlens array, M and N are numbers of the row and columns of the microlens array, $k = 2\pi/\lambda$ is a wave number corresponding the wavelength $\lambda$, and x and y are coordinates in the CCD detector. It is indicated by analysis that when the measured silicon wafer is located at the cofocal plane of the frontal set of lens 2 and the posterior set of lens 4, the diffraction light spot in the CCD detector 6 is at the focus of the respective subunits of the microlens array 5.

The method for detecting focus plane is characterized by that when the measured silicon wafer 3 is at a defocused position, the emerging planar wavefront of the light source and the beam collimating and expanding unit 1 after passing through the 4f system becomes a spherical wavefront and the microlens array 5 enables imaging of the spherical wavefront.

In particular, according a triangulation theory, when the silicon wafer is defocused an amount of h in an upwards and downwards direction, it corresponds to a defocusing distance in an axial direction equal to 2h sin β, in which β is an angle between an optical axis of the system for detecting focus plane and the measured silicon wafer 3.

The method for detecting focus plane is characterized by that if the measured silicon wafer 3 is at a defocused position, the microlens array 5 enables imaging of the spherical wavefront. Based on the Hartmann wavefront detection principle, centers of the respective subunits of the microlens array 5, centers of the diffraction light spots corresponding to the subunits, and the center of the curvature of the spherical wavefront are collinear. For the imaging of the spherical wavefront, the center of its diffraction light spot satisfies the following equation:

$$\frac{\Delta p_{mn}}{f} = \frac{\sqrt{m^2+n^2}\,d}{L} = \frac{\sqrt{m^2+n^2}\,d}{\frac{f_4^2}{s}+2f+d_f},$$

in which, $\Delta p_{mn}$ is a shift of the light spot imaged on the planar and spherical wavefront by the subunit at the $m^{th}$ row and the $n^{th}$ column of the microlens array 5; L is a distance from the center of the curvature of the spherical wavefront to the focal plane of the microlens array 5 in the axial direction; $f_4$ is the focal length of the posterior set of lens 4; and $d_f$ is a distance from a image-side focal plane of the posterior set of lens 4 to a objective-side focal plane of the microlens array 5.

The method for detecting focus plane is characterized by that the measurement for detecting focus plane of the measured silicon wafer 3 is implemented by shifting the imaged light spots for the planar wavefront and the spherical wavefront through the microlens array 5. Equations are established for different subunits of the microlens array 5 as follows:

$$\begin{cases} \dfrac{\Delta p_{11}}{f} = \dfrac{\sqrt{2}\,d}{\frac{f_4^2}{s}+2f+d_f} \\ \dfrac{\Delta p_{12}}{f} = \dfrac{\sqrt{5}\,d}{\frac{f_4^2}{s}+2f+d_f} \\ \quad\cdots \\ \dfrac{\Delta p_{mn}}{f} = \dfrac{\sqrt{m^2+n^2}\,d}{\frac{f_4^2}{s}+2f+d_f} \end{cases}$$

Solutions for the equations (s) are solved by a least square method, so that defocus positions of the measured silicon wafer 3 which can be measured for different subunits of the microlens array 5 may be calculated as follows:

$$\bar{s} = \frac{1}{MN}\sum_{m=1}^{M}\sum_{n=1}^{N} s_{mn}.$$

The method for detecting focus plane is characterized by that he measurement for detecting focus plane of the measured silicon wafer 3 is implemented by averaging the defocusing distances measured for different subunits. Thus, a calculation for a plurality of measurement data can be accomplished by one measurement, and the accuracy and efficiency for detecting focus plane of the silicon wafer may be improved.

Figure 2A:
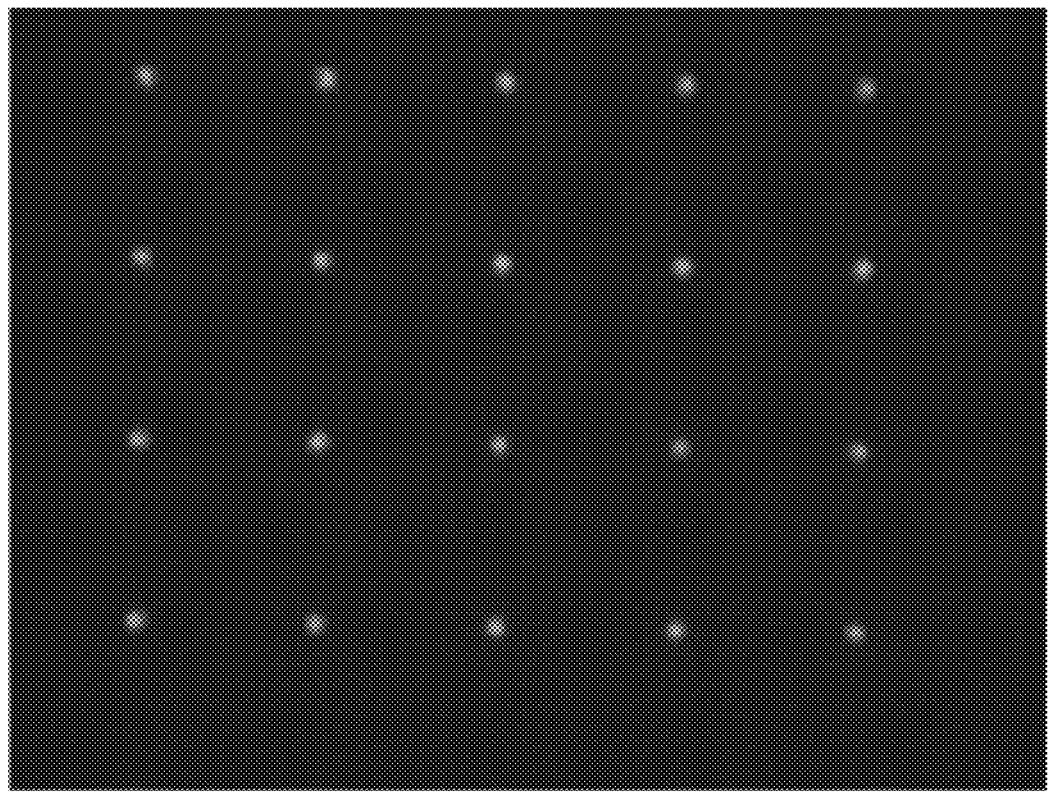
FIG. 2 shows schematic views of the imaged light spots for the spherical wavefront and the planer wavefront in the method for detecting focus plane according to the present invention, in which FIG. 2(*a*) shows an imaged light spot for the planer wavefront.
Figure 2B:
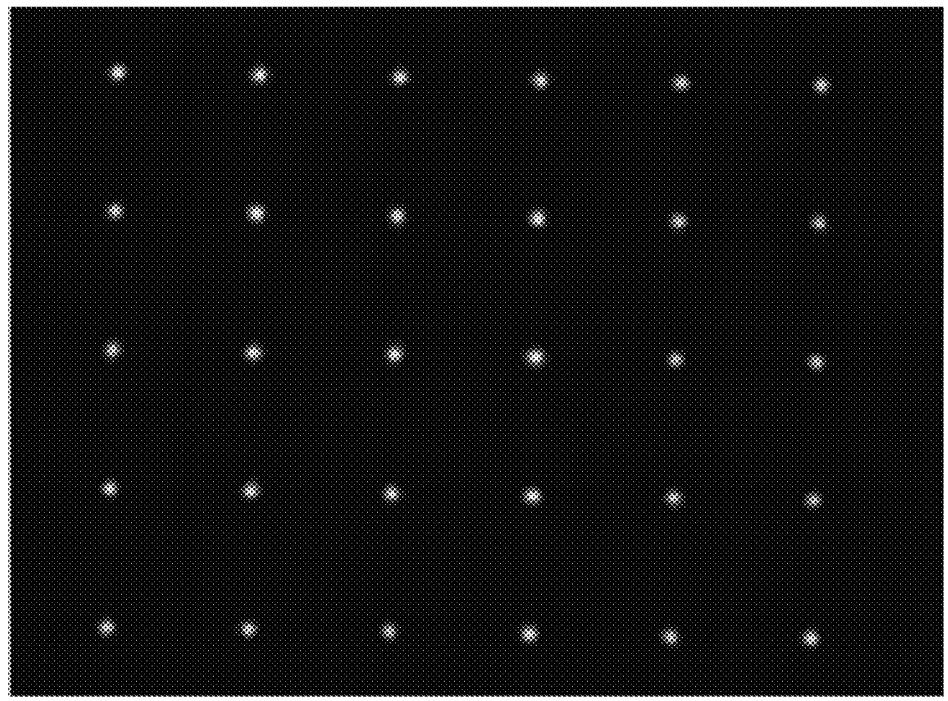
Figure 2C:
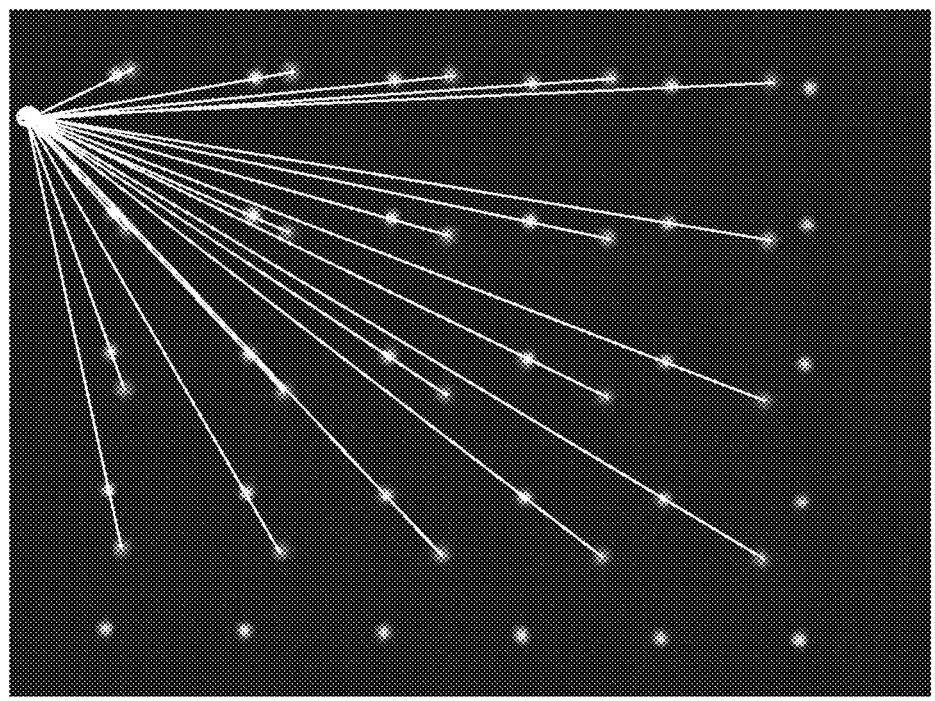

FIG. 2 shows schematic views of the imaged light spots for the spherical wavefront and the planer wavefront in the method for detecting focus plane according to the present invention, in which FIG. 2(a) shows an imaged light spot for the planer wavefront; FIG. 2(b) shows an imaged light spot for the spherical wavefront; and FIG. 2(c) shows a comparison between the imaged light spots for the planar wavefront and the spherical wavefront. The imaged light spots for the planar wavefront and the spherical wavefront are regularly distributed. Based on the detection principle as mentioned in the present disclosure, the subunits of the microlens array enable imaging of the planar wavefront and the spherical wavefront, so that centers of the imaged light spots for the planar wavefront and the spherical wavefront of the same subunit are collinear with the center of the curvature of the spherical wavefront. That is, the centers of the light spots for the planar wavefront and for the spherical wavefront for all of the subunits are continuously intersected at the same point on the image plane, as shown in FIG. 2(c).

In general, the method for detecting focus plane based on Hartmann wavefront detection principle has advantages such as simple configuration, higher accuracy and efficiency, so it meets the requirements for photolithography machines in a high accuracy. The technique and principles which are not illustrated in detail in the present disclosure belongs to common knowledge in the art for those skilled in the art.

We claim:

1. A method for detecting focus plane based on Hartmann wavefront detection principle, which is implemented by a system for detecting focus plane constituted of a light source and beam collimating and expanding unit, frontal set of lens, measured silicon wafer, posterior set of lens, microlens array and CCD detector, wherein the front set of lens and the posterior set of lens forms a 4f system, and the measured silicon wafer is on a cofocal plane of the 4f system, the method for detecting focus plane is characterized by that an emerging planar wavefront of the light source and the beam collimating and expanding unit passes through the frontal set of lens, is incident on a surface of the measured silicon wafer and reflected by the measured silicon wafer, passes through the posterior set of lens and the microlens array, and finally imaged in the CCD detector; if the measured silicon wafer is located on the cofocal plane of the frontal set of lens and the posterior set of lens, the microlens array enables imaging of the planar wavefront; and if the measured silicon wafer is defocused, the microlens array enables imaging of the spherical wavefront; and the measurement for detecting the focus plane of the measured silicon wafer is accomplished based on varied situations of the imaged light spot in the CCD detector.

2. The method for detecting focus plane according to claim 1, wherein if the measured silicon wafer is located on the cofocal plane of the frontal set of lens and the posterior set of lens, the emerging planar wavefront of the light source and the beam collimating and expanding unit after passing through the 4f system is still a planer wavefront, so the microlens array enables imaging of the planar wavefront, and an intensity of diffraction light in the CCD detector 6 is shown as:

$$I = \sum I_0\left[\frac{2J_1(Z)}{Z}\right] = \sum_{n=-N}^{N}\sum_{m=-M}^{M} I_0 \left[\frac{2J_1\left(\frac{kd\sqrt{(x-nd)^2+(y-md)^2}}{2f}\right)}{\frac{kd\sqrt{(x-nd)^2+(y-md)^2}}{2f}}\right],$$

in which, $J_1(Z)$ is the first order Bessel function, d is a caliber of subunits of the microlens array, f is a focal length of the microlens array, M and N are numbers of the row and columns of the microlens array, $k=2\pi/\lambda$ is a wave number corresponding the wavelength $\lambda$, and x and y are coordinates in the CCD detector. It is indicated by analysis that when the measured silicon wafer is located at the cofocal plane of the frontal set of lens 2 and the posterior set of lens 4, the diffraction light spot in the CCD detector 6 is at the focus of the respective subunits of the microlens array 5.

3. The method for detecting focus plane according to claim 1, wherein when the measured silicon wafer is at a defocused position, the emerging planar wavefront of the light source and the beam collimating and expanding unit after passing through the 4f system becomes a spherical wavefront and the microlens array enables imaging of the spherical wavefront.

4. The method for detecting focus plane according to claim 3, wherein according a triangulation theory, when the silicon wafer is defocused an amount of h in an upwards and downwards direction, it corresponds to a defocusing distance in an axial direction equal to 2h sin β, in which β is an angle between an optical axis of the system for detecting focus plane and the measured silicon wafer.

5. The method for detecting focus plane according to claim 4, wherein the measurement for detecting focus plane of the measured silicon wafer is implemented by shifting the imaged light spots for the planar wavefront and the spherical wavefront through the microlens array; and equations are established for different subunits of the microlens array as follows:

$$\begin{cases} \dfrac{\Delta p_{11}}{f} = \dfrac{\sqrt{2}\,d}{\dfrac{f_4^2}{s} + 2f + d_f} \\ \dfrac{\Delta p_{12}}{f} = \dfrac{\sqrt{5}\,d}{\dfrac{f_4^2}{s} + 2f + d_f} \\ \quad \cdots \\ \dfrac{\Delta p_{mn}}{f} = \dfrac{\sqrt{m^2+n^2}\,d}{\dfrac{f_4^2}{s} + 2f + d_f} \end{cases}$$

wherein solutions for the equations are solved by a least square method, so that defocus positions of the measured silicon wafer which can be measured for different subunits of the microlens array 5 may be calculated as follows:

$$\bar{s} = \frac{1}{MN}\sum_{m=1}^{M}\sum_{n=1}^{N} s_{mn}.$$

6. The method for detecting focus plane according to claim 1, wherein if the measured silicon wafer is at a defocused position, the microlens array enables imaging of the spherical wavefront; and based on the Hartmann wavefront detection principle, centers of the respective subunits of the microlens array, centers of the diffraction light spots corresponding to the subunits, and the center of the curvature of the spherical wavefront are collinear; for the imaging of the spherical wavefront, the center of its diffraction light spot satisfies the following equation:

$$\frac{\Delta p_{mn}}{f} = \frac{\sqrt{m^2+n^2}\,d}{L} = \frac{\sqrt{m^2+n^2}\,d}{\dfrac{f_4^2}{s} + 2f + d_f},$$

in which, $\Delta p_{mn}$ is a shift of the light spot imaged on the planar and spherical wavefront by the subunit at the $m^{th}$ row and the $n^{th}$ column of the microlens array; L is a distance from the center of the curvature of the spherical wavefront to the focal plane of the microlens array in the axial direction; $f_4$ is the focal length of the posterior set of lens; and $d_f$ is a distance from a image-side focal plane of the posterior set of lens to a objective-side focal plane of the microlens array.

7. The method for detecting focus plane according to claim 6, wherein the measurement for detecting focus plane of the measured silicon wafer is implemented by averaging the defocusing distances measured for different subunits.

\* \* \* \* \*